United States Patent
Takemoto et al.

(10) Patent No.: US 7,696,622 B2
(45) Date of Patent: Apr. 13, 2010

(54) MEMS DEVICE FORMED INSIDE HERMETIC CHAMBER HAVING GETTER FILM

(75) Inventors: Tsuyoshi Takemoto, Amagasaki (JP); Hiroshi Nishida, Amagasaki (JP); Osamu Torayashiki, Amagasaki (JP); Takashi Ikeda, Amagasaki (JP); Ryuta Araki, Amagasaki (JP)

(73) Assignee: Sumitomo Precision Products Co., Ltd. (JP)

( * ) Notice: Subject to any disclaimer, the term of this patent is extended or adjusted under 35 U.S.C. 154(b) by 0 days.

(21) Appl. No.: 12/147,197

(22) Filed: Jun. 26, 2008

(65) Prior Publication Data
US 2009/0001565 A1    Jan. 1, 2009

(30) Foreign Application Priority Data
Jun. 27, 2007   (JP)  ............................. 2007-168966
Jun. 13, 2008   (JP)  ............................. 2008-155682

(51) Int. Cl.
*H01L 23/06* (2006.01)

(52) U.S. Cl. ............... 257/729; 257/678; 257/E23.191; 438/106

(58) Field of Classification Search .............. 257/414, 257/678, 729, E23.191; 438/106
See application file for complete search history.

(56) References Cited

U.S. PATENT DOCUMENTS
2006/0063462 A1* 3/2006 Ding et al. .................... 445/25

FOREIGN PATENT DOCUMENTS

| JP | 10-122869 A | 5/1998 |
|---|---|---|
| JP | 10-213441 A | 8/1998 |
| JP | 2002-158214 A | 5/2002 |
| JP | 2004-228556 A | 8/2004 |
| JP | 2004-296474 A | 10/2004 |
| JP | 2005-016965 A | 1/2005 |
| JP | 2007-035929 A | 2/2007 |

* cited by examiner

*Primary Examiner*—Sue Purvis
*Assistant Examiner*—Whitney Moore
(74) *Attorney, Agent, or Firm*—Dorsey & Whitney LLP

(57) ABSTRACT

A MEMS device including a getter film formed inside a hermetic chamber provides stable performance of the MEMS device by electrically stabilizing the getter film. The MEMS device includes a movable portion and a fixed portion formed inside the hermetic chamber. The hermetic chamber is formed by a base material of the MEMS device and glass substrates and having a cavity and cavities made therein. A part of any continuous getter film formed inside the hermetic chamber connects to only one of any one or a plurality of predetermined electrical potentials of the fixed portion and a ground potential of the fixed portion through the base material of the MEMS device.

11 Claims, 8 Drawing Sheets

MEMS DEVICE FORMED INSIDE HERMETIC CHAMBER HAVING GETTER FILM

BACKGROUND OF THE INVENTION

1. Field of the Invention

The present invention relates to a Micro Electro Mechanical Systems (MEMS) device formed inside a hermetic chamber having a getter film.

2. Description of the Related Art

Silicon-based MEMS devices are rapidly progressing in a growing number of technical fields. In recent years, MEMS devices are utilized not only in micro turbines and sensors, but also in communications and medical fields. Getter technology represents a fundamental element of MEMS technology. Getters are important for stabilizing a performance of MEMS devices formed inside hermetic chambers. Improved getter technology is indispensable to an advancement of many fields, especially fields requiring miniaturization in applications such as sensors.

Conventional getters are formed by vapor deposition on a bottom of a cavity made in a glass substrate. A hermetic chamber is formed, for example, by bonding silicon and glass substrates by anodic bonding. The getter absorbs an amount of oxygen or other residual gases remaining after the anodic bonding, as described in Japanese Published Unexamined Patent Application No. 10-122869.

Japanese Published Unexamined Patent Application No. 10-213441 discusses a method of reactivating a getter formed on a bottom of a cavity made in a glass substrate, wherein the reactivation is performed after sealing the chamber by applying difference in electrical potentials to the getter to produce an electric current therein.

Unfortunately, a location of the getter film inside the hermetic chamber may affect various aspects of performance of the MEMS device. For example, in the case where a portion of a getter is too close to an electrode formed on a MEMS device, even though no physical contact is made therebetween, electric noise may transmit from the electrode via the getter film coupled capacitively to an electrode of a sensor or a driver, thereby impairing the operation of the MEMS device.

Such problems are especially pronounced in the case where a miniature MEMS device is utilized in, for example, a resonator gyroscope chip having a substantially square cross-section occupying 100 mm$^2$ or less when viewed from the front, as illustrated in FIG. 1. In particular, the miniaturization of a device requires a smaller volume of hermetic chamber. Gases such as residual gases and gases released into the hermetic chamber during production remain inside the hermetic chamber. The smaller hermetic chamber volume results in stronger influences of these gases on the pressure inside the hermetic chamber. As a result, a detection sensitivity of a MEMS sensor, for example, may be noticeably impaired. Thus, the technical significance of the getter region for miniature MEMS devices is particularly high. Unfortunately, it is very difficult to form conventional getters that solve the problems recited above while maintaining the required gas absorption capabilities.

SUMMARY OF THE INVENTION

The present invention is directed to solve the above recited technical obstacles, thereby greatly contributing to the optimization of the spatial relationship between a MEMS device formed inside a hermetic chamber and a getter useful for maintaining the performance thereof. The inventors focused firstly made a cavity in a substrate to form a hermetic cavity and focused on the depth of the cavity in the case where a getter region is formed on the bottom of the cavity. As a result of various experiments, it became apparent that a technical dilemma exists relating to a position of the getter region and the cavity depth.

In particular, in the case of shallow cavities, even, for example, in the case where a mask is used to form the getter film only on the bottom of the cavity, the location of the getter film becomes proximal to electrodes of the MEMS device, thereby resulting in electric noise transmitting via the getter film coupled capacitively to electrodes of of sensors or drivers. Conversely, technical obstacles exist in the case where the cavity is deep, as described herewith by an example of a conventional MEMS device application. FIG. 12 is a partial cross-sectional view of a conventional ring or hoop-like shape resonator gyroscope 700 along the C-C line of FIG. 2. In the case where a deep cavity is made, a first glance suggests that a mask may be used to successfully form a getter film substantially only on the bottom of a deep cavity 74, but unfortunately this is not practically so. Conventional techniques such as sputtering create a getter film 73 that not only covers the bottom of the cavity 74 but also extends along the sides thereof, as illustrated in FIG. 12. Thus, it is difficult to maintain distances sufficient to prevent effects among members such as the getter film 73 and the primary mode sensing electrode 75. As a result, deep cavities do not solve the problems of shallow cavities. Moreover, deep cavities have disadvantages during manufacturing such as longer processing times and poorer process yields.

The inventors performed extensive and diligent research in light of the problems recited above. As a result, a configuration was created, including a getter region formed on a bottom and/or sides of a cavity made in a substrate and a deliberate stabilization of an electrical potential of the getter, thereby completing the present invention.

One MEMS device according to the present invention includes a movable portion and a fixed portion formed inside a hermetic chamber. The hermetic chamber is formed by a glass substrate having a cavity made therein and a base material of the MEMS device. One or a plurality of getter films are formed inside the hermetic chamber and interconnect therein. A portion of the getter film is connected via the base material of the MEMS device to only one of any one or a plurality of predetermined electrical potentials of the fixed portion and a ground potential of the fixed portion.

Here, the getter film is not limited to a continuous single entity or one interconnected getter film. For example, getter films may be divided into a plurality of regions. Even in a case where the getter film is divided into a plurality of regions, each getter film connects via the base material of the MEMS device to only one predetermined electrical potential or only a ground potential, respectively. In order words, each of the continuous getter films may not connect simultaneously to two predetermined electrical potentials having a difference therebetween. Likewise, the scope of the present invention includes the case where the getter films are divided into a plurality of regions, each region connects to a predetermined electrical potential (including a ground potential), respectively, and the predetermined electrical potentials differ from one another.

According to this MEMS device, the getter film is formed inside the hermetic chamber and connected to only one predetermined electrical potential or a ground potential, thereby preventing the potential of the getter film from so-called floating even during the operation of the MEMS device.

Therefore, even in the case where the getter film is formed near an electrode of the MEMS device, the electrical potential applied to the getter is stabilized, thereby preventing the transmission of electric noise from the electrode through the getter to an electrode of a sensor or a driver. In addition, the cavity made in the glass substrate for forming the hermetic chamber can be made much shallower than that of conventional art. Therefore, less processing time, simpler manufacturing steps, and greatly reducing manufacturing costs can be achieved.

Another MEMS device according to the present invention includes a movable portion and a fixed portion formed inside a hermetic chamber. The hermetic chamber is formed by a glass substrate having a cavity made therein and a base material of the MEMS device. A getter film is formed on a bottom and a side surface, or a side surface of the cavity. The getter film extends from the at least one of the bottom surfaces and the side surfaces via a surface of a support of the glass substrate for supporting the MEMS device, contacting to a surface of at least a portion of the fixed portion connecting to only any one or a plurality of predetermined electrical potentials.

Yet another MEMS device according to the present invention includes a movable portion and a fixed portion formed inside a hermetic chamber. The hermetic chamber is formed by a glass substrate having a cavity made therein and a base material of the MEMS device. A getter film is formed on a bottom and a side surface, or a side surface of the cavity. The getter film on the bottom and/or the side surface of the cavity extends to a surface of at least a portion of the fixed portion and contacts thereto, the fixed portion being connected to only one ground potential.

According to each of the MEMS devices recited above, the getter film formed inside the hermetic chamber is connected to only one or a plurality of predetermined electrical potentials, thereby preventing the potential of the getter film from floating even during the operation of the MEMS device. Therefore, even in the case where the getter film is formed near each of electrodes of the MEMS device, the electrical potential applied to the getter film is stabilized, thereby preventing the transmission of electric noise from the electrode via the getter to an electrode of a sensor or a driver. In addition, the cavity made in the glass substrate for forming the hermetic chamber can be made much shallower than that of conventional art. Therefore, less processing time, simpler manufacturing steps, and greatly reducing manufacturing costs can be achieved. Connecting the getter film to only a ground potential provides a more stable potential than connecting the getter film to only a predetermined electrical potential other than a ground potential, thereby further reducing electric noise transmitted to the electrodes of the sensors or the drivers, thus providing more favorable characteristics.

Here, the fixed portion of the present invention may be a portion or an entirety of a non-moving member having a prescribed role in the MEMS device including an electrical effect, a physical effect, or an advantage during a manufacturing process. Likewise, the non-moving member having the prescribed role may in its entirety be the fixed portion, or may include only a portion that is the fixed portion. In all of the aspects of the present invention recited above, favorable absorption of residual gases and gases released into the hermetic chamber is provided by using a getter film material including at least one non-evaporable metal selected from the group consisting of titanium, zirconium, vanadium, aluminum, tantalum, tungsten, and molybdenum.

According to a MEMS device of the present invention, a getter film is formed inside a hermetic chamber and connected to only one predetermined electrical potential or ground potential, thereby preventing the potential of the getter film from floating even during the operation of the MEMS device. Therefore, even in the case where the getter film is formed near an electrode of the MEMS device, the electrical potential applied to the getter is stabilized, thereby preventing a transmission of electric noise from the electrode through the getter to an electrode of a sensor or a driver. In addition, the cavity made in the glass substrate for forming the hermetic chamber can be made much shallower than that of conventional art. Therefore, less processing time, simpler manufacturing steps, and greatly reducing manufacturing costs can be achieved.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

Figure 1:
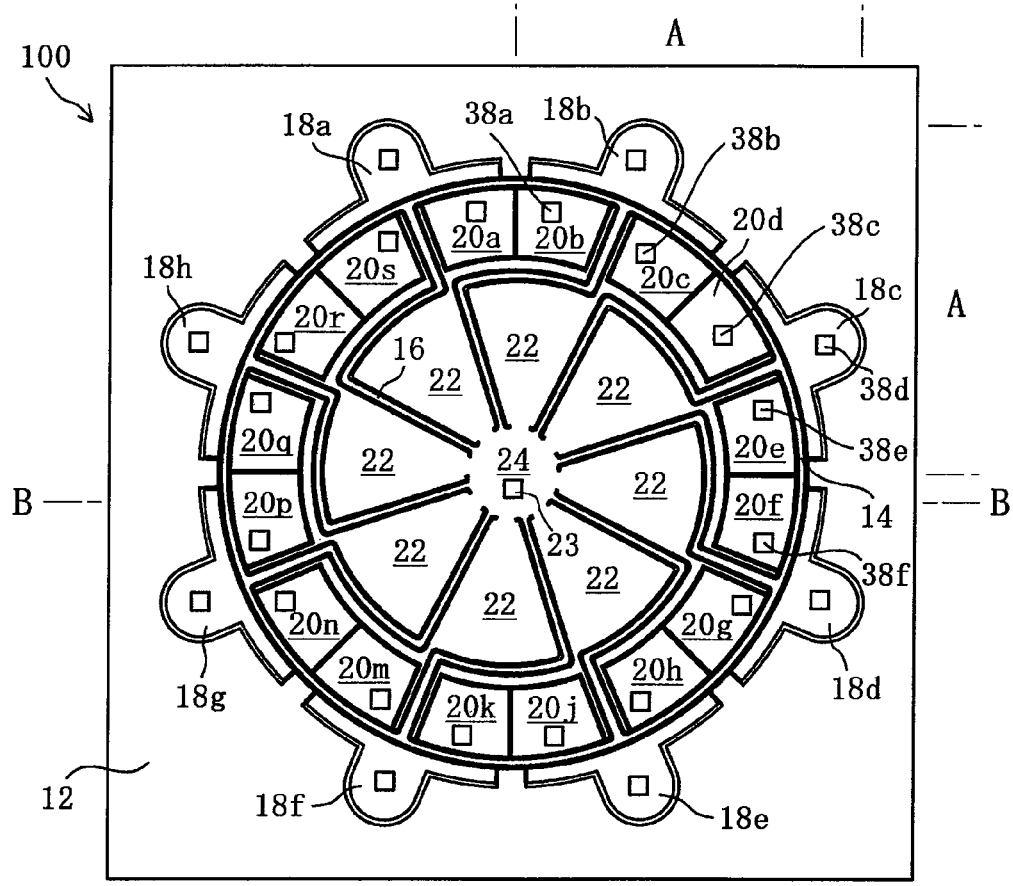
FIG. 1 is a front view of a MEMS device according to an exemplary embodiment of the present invention.

Herewith, several exemplary embodiments of the present invention are described with reference to the drawings. In all drawings and descriptions thereof, the same reference numerals are used for similar components unless otherwise noted. Some components of exemplary embodiments are not drawn to scale. Some reference numerals are omitted for better readability in some drawings.

Figure 2:
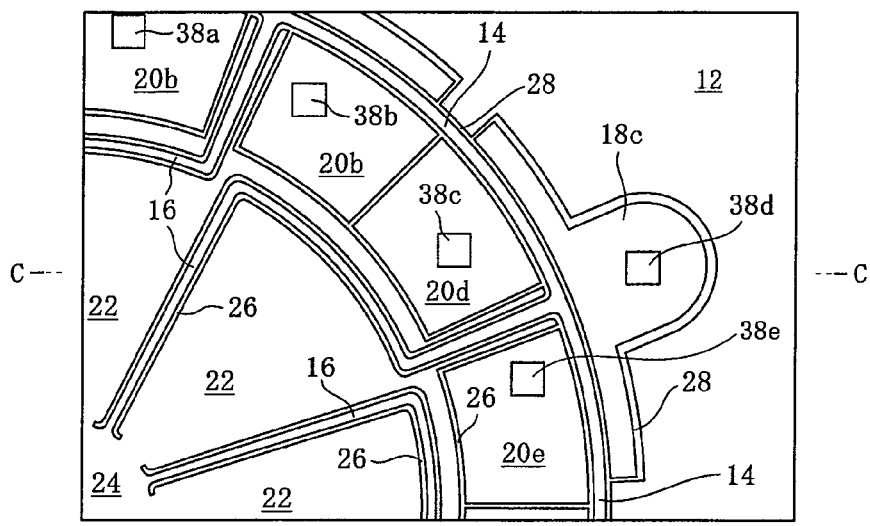
FIG. 2 is a partially enlarged view of the A-A quadrant of the MEMS device illustrated in FIG. 1.
Figure 3:
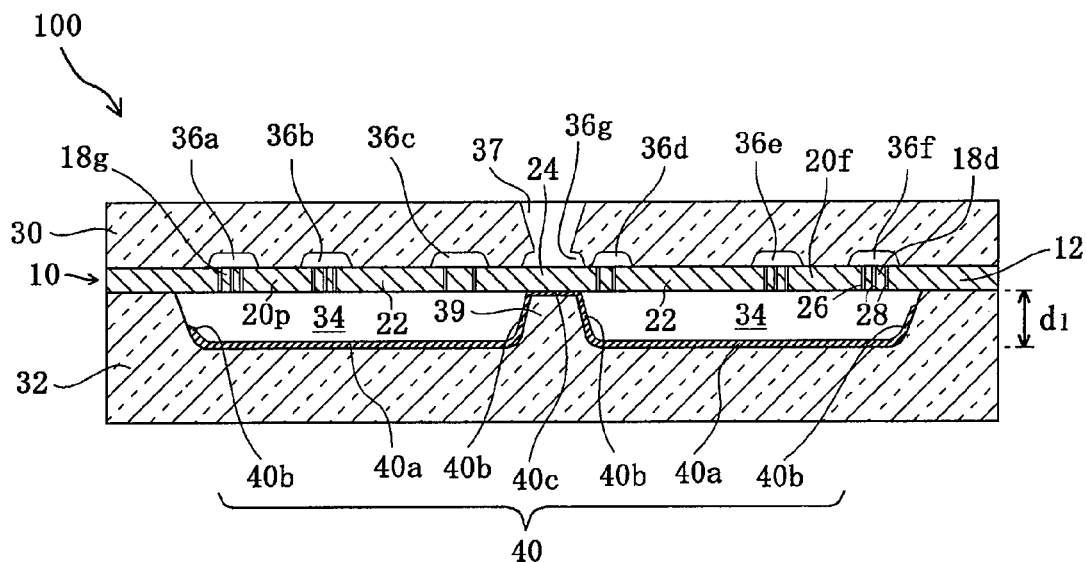
FIG. 3 is a cross-sectional view along the B-B line of FIG. 1
Figure 4:
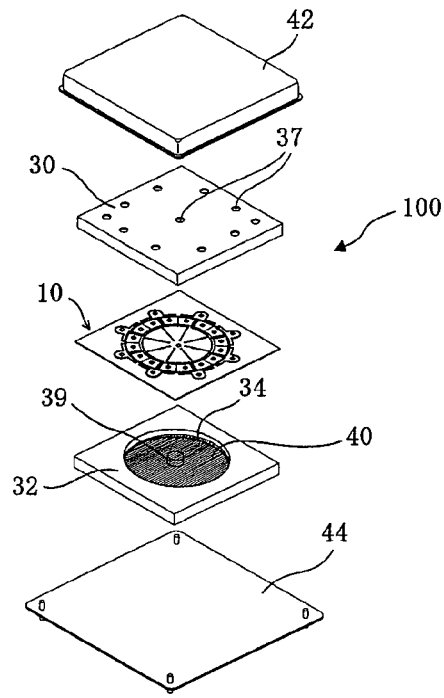
FIG. 4 is an exploded perspective view of a MEMS device including a package according to an exemplary embodiment of the present invention.

Structures performing central roles in a MEMS device, i.e., a ring or hoop-like shape resonator gyroscope 100, according to an exemplary embodiment of the present invention are illustrated in the front view of FIG. 1. FIG. 2 is a partially enlarged view of the A-A quadrant of FIG. 1. FIG. 3 is a cross-sectional view along the B-B line of FIG. 1. FIG. 4 is an exploded perspective view of the ring or hoop-like shape resonator gyroscope 100 according to this exemplary embodiment, including a package.

The MEMS device according to this exemplary embodiment illustrated in FIG. 1 through FIG. 4 is the ring or hoop-like shape resonator gyroscope 100. The ring or hoop-like shape resonator gyroscope 100 includes: an upper glass substrate 30, having cavities 36a, 36b, 36c, 36d, 36e, 36f, and 36g made therein; a lower glass substrate 32, having a cavity 34 made therein; a silicon vibrator (hereinafter referred to as "vibrator") 10 formed by such techniques as trench etching; and a structure having the vibrator 10 disposed between the upper glass substrate 30 and the lower glass substrate 32, as illustrated in FIG. 3. Here, corresponding faces of the upper glass substrate 30, the lower glass substrate 32, and the vibrator 10 are fused together by anodic bonding, thereby forming a hermetic chamber defined in part by the cavity 34 and the cavities 36a through 36g.

The cavity made in the lower glass substrate 32 has an annular shape while leaving a column-shaped structure 39 in a central zone, as illustrated in FIG. 4. A getter film 40 is formed on a surface of the column-shaped structure 39, contacts the central portion 24 of the vibrator 10, and thereby supports a portion of the vibrator 10. Other portions of the vibrator 10 not supported by the column-shaped structure 39, such as for example electrodes for trimming the natural frequency 20a through 20s, are bonded to the upper glass substrate 30 and suspended thereby, as illustrated in FIG. 3.

Holes such as holes 37 are made in the upper glass substrate 30 to enable wires for operating the ring or hoop-like shape resonator gyroscope 100 to pass therethrough for connection to members such as electrode pads 38a, 38b, 38c, 38d, 38e, and 38f. One cavity of the upper glass substrate 30, i.e., the cavity 36g, communicates with the holes 37, as illustrated in FIG. 3. In particular, the upper glass substrate 30, the lower glass substrate 32, and the vibrator 10 are bonded together as illustrated in FIG. 4, after which the wires from the each of electrodes is connected to output pins (not illustrated) on a resonator gyroscope platform 44. Then, the ring or hoop-like shape resonator gyroscope 100 is sealed by resistance welding of a lid 42 to the resonator gyroscope platform 44 in a dry nitrogen atmosphere. Sealing the ring or hoop-like shape resonator gyroscope 100 in this way locks out air, thereby preventing penetration of moisture and other contaminants that may impair the performance thereof.

According to the MEMS device of this exemplary embodiment, the getter film 40 is formed on the bottom of the lower glass substrate 32, the sides of the lower glass substrate 32, and a surface of the lower glass substrate 32, the surface having no cavity formed thereupon. In particular, the getter film 40 includes: a getter film region 40a formed on the bottom of the cavity 34; a getter film region 40b formed on sides of the cavity; and a getter film region 40c on a surface of a region of the lower glass substrate 32 having no cavity formed thereupon. The getter film regions are interconnected as illustrated in FIG. 3. According to this exemplary embodiment, a portion of the sides of the cavity includes a side of the column-shaped structure 39 supporting a portion of the vibrator 10. Furthermore, the getter film according to this exemplary embodiment is a thin titanium film having a thickness of not less than 0.1 μm and not more than 2 μm.

However, according to this exemplary embodiment, a portion of the getter film, i.e., the getter film region 40c, is formed on a surface of the lower glass substrate 32 having no cavity made thereupon. The formation of the getter film region 40c thereby results in compressive stresses on the lower glass substrate 32 and the central portion 24 of the vibrator 10. Therefore, the cavity 36g provides a recess around the region of vibrator 10 undergoing compressive stress, i.e., the entire region of the central portion 24 as the fixed portion, thereby avoiding bonding with the upper glass substrate 30, as illustrated in FIG. 3. The central portion 24 is allowed thereby to flex upward to relieve stress, thus sufficiently reducing the effects of the compressive stress on the vibrator 10 and providing stable operations thereof.

As described above, a portion of the getter film 40 according to this exemplary embodiment contacts a surface of the central portion 24, i.e., a portion of the fixed portion of the vibrator 10. Thus, the getter film 40 contacts a portion of the vibrator 10 having a predetermined electrical potential, thereby preventing a floating potential of the getter 40. In particular, one continuous body is formed, including: tabs remaining from etching 22 defined by a trench 26 cutting through the base material; suspensions 16 likewise defined by the trench 26 and a trench 28; the central portion 24, i.e., fixed ends of the suspensions 16; and a ring 14. In other words, the central portion 24 is electrically connected to the tabs remaining from etching 22, the ring 14, and the suspensions 16. During operation of the vibrator 10, a direct current voltage is applied to the ring 14 and the suspensions 16 through the central portion 24 by a direct-current power source (not illustrated). Thus, the entire getter film 40, i.e., the getter film region 40a, the getter film region 40b, and the getter film region 40c, substantially share the electrical potential applied to the central portion 24, thereby preventing a floating condition. The electrical potential is a direct-current electrical potential and therefore stabilizes the electrical potential of the getter film 40 as well.

According to this exemplary embodiment, alternating electrical potentials are applied to primary mode drive electrodes 18a and 18e and secondary mode drive electrodes for nulling the secondary mode 18d and 18h, and for example even in the case where the electrodes 18a, 18e, 18d, and 18h are portions of the fixed portion, the getter film 40 does not contact the surfaces of the electrodes 18a, 18e, 18d, and 18h. Such contact is avoided because in the case when an alternating electrical potential is applied to the getter film 40, electric noise from the alternating electrical potential is transmitted to an electrode of a sensor or a driver. Moreover, in the case when the continuous getter film 40 according to this exemplary embodiment contacts, for example, more than one fixed portion, all of the fixed portions receive substantially the same electrical potential from a direct-current power source. In the case where a difference in electrical potential exists across the getter film 40 during operation of the vibrator 10, the getter film 40 may release heat, thereby impairing the performance of the vibrator 10. In addition, getters often are made of conducting metals, and therefore may result in an electrical short in the case where a getter is connected to electrodes that differ from one electrical potential to another. Such an electrical short may disable the operation of the MEMS device.

According to conventional art, however, a getter film is formed on the bottom of the cavity 34 formed on the lower glass substrate 32. The getter film functions as a floating electrode, and therefore the cavity must be made to a sufficient depth of, for example, 200 μm or more to avoid electric noise transmitting through a capacitive coupling from an electrode of the vibrator 10 to an electrode of a sensor or a driver. Conversely, for a MEMS device application according to this exemplary embodiment, the cavity 34 may have a depth d1 of 30 μm, as illustrated in FIG. 3, and yet the configuration as recited above prevents the getter film from transmitting electric noise by a capacitive coupling from one electrode to another. In the case of a MEMS device in which the movable portion moves substantially in the same plane as the fixed portion, such as the MEMS device according to this exemplary embodiment, the depth d1 can be not less than 5 μm. In the case of a MEMS device in which the movable portion moves substantially perpendicular to the plane of the fixed portion, it is favorable for the depth d1 to be not less than 10 μm. There is no particular maximum limit to the depth of the cavity 34, but considerations such as minimizing the time to make the cavity 34 and the amount of gases released, considered to be a function of the surface areas of the inner walls of the hermetic chamber, dictate that it is favorable to use a depth d1 of 60 μm or less. Thus, the etching depth can be made much shallower than that of conventional art. Therefore, less processing time and simpler manufacturing steps can be achieved. The cavities in the upper glass substrate 30 may have similar depths as those of the lower glass substrate 32. The depths of the cavities in the upper glass substrate 30 may be the same as the depths of the cavities in the lower glass or reduced further providing that the movement of the vibrator 10 is not impaired.

In addition, noble gases such as argon gas residing inside the hermetic chamber and not absorbed by the getter film are sealed inside the hermetic chamber at pressures not less than 1 Pa and not more than 20 Pa, thereby preventing an extreme vacuum inside the hermetic chamber and providing an appropriate Q factor of the resonator gyroscope. Reducing the depth of the cavity 34 in the lower glass substrate 32 as recited above allows a much thinner application as compared to that of conventional art, thereby allowing a much thinner glass substrate without compromising the strength of the entire MEMS device. For example, the thickness of a conventional glass substrate is about 600 μm, while the thickness of the same according to this exemplary embodiment is about 450 μm. Thus, compact MEMS devices can be provided. As a result, manufacturing costs can be reduced greatly over those of conventional art.

Herewith, the operation of the ring or hoop-like shape resonator gyroscope 100 according to this exemplary embodiment is described with reference to FIG. 1 through FIG. 3. As described above, a direct-current electrical potential from a direct-current power source (not illustrated) is applied to the central portion 24 of the ring or hoop-like shape resonator gyroscope 100. An alternating electrical potential from an alternating-current power source (not illustrated) is applied to the primary mode driving electrodes 18a and 18e.

The MEMS device according to this exemplary embodiment includes primary mode sensing electrodes 18c and 18g, secondary mode sensing electrodes 18b and 18f, secondary mode drive electrodes for nulling the secondary mode 18d and 18h, and electrodes for trimming the natural frequency 20a through 20s. Secondary mode drive electrodes for nulling the secondary mode 18d and 18h are connected to an alternating-current power source. The electrodes for trimming the natural frequency 20a through 20s are connected to direct-current power sources. The trench 28 electrically and physically partitions a periphery 12 from the ring 14 and each of the electrodes 18a through 18h disposed around the periphery of the ring 14. The periphery 12 is connected to a ground potential.

First, an alternating electrical potential is applied to the primary mode drive electrodes 18a and 18e, thereby causing an electrostatic attraction between the ring 14 and the primary mode drive electrodes 18a and 18e, thereby creating a primary vibration mode of the ring or hoop-like shape resonator gyroscope 100. The primary vibration mode is detected by the primary mode sensing electrodes 18c and 18g. Then, applying an angular velocity causes a Coriolis force and results in a secondary vibration mode. The secondary vibration mode is detected by the secondary mode sensing electrodes 18b and 18f. Electrical potentials are applied to the electrodes for trimming the natural frequency 20a through 20s, thereby causing a difference in potential between the ring 14 and each of the electrodes 20a through 20s. These differences in potential match the natural frequency of the primary vibration mode to the natural frequency of the secondary vibration mode. Then, an electrical current produced by a change in the electrostatic capacitance corresponding to the applied angular velocity is detected by the secondary mode sensing electrodes 18b and 18f, and a feedback circuit applies an output voltage to the secondary mode drive electrodes for nulling the secondary mode 18d and 18h. Monitoring this output voltage allows a derivation of the angular velocity.

Herewith, a method for manufacturing the MEMS device according to this exemplary embodiment is described with reference to FIG. 5A through FIG. 5F. The description of the manufacturing method refers to the partial cross section of the vibrator 10 along line C-C in FIG. 2.

Figure 5A:
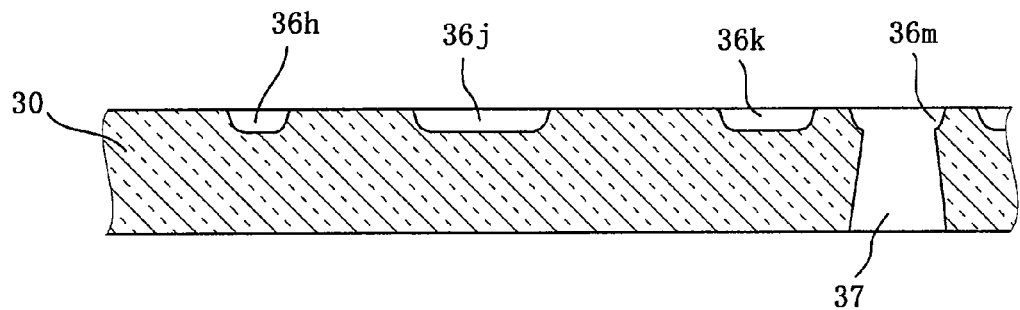
FIG. 5A is a cross-sectional view illustrating a process step for manufacturing the MEMS device according to an exemplary embodiment of the present invention.
Figure 5B:
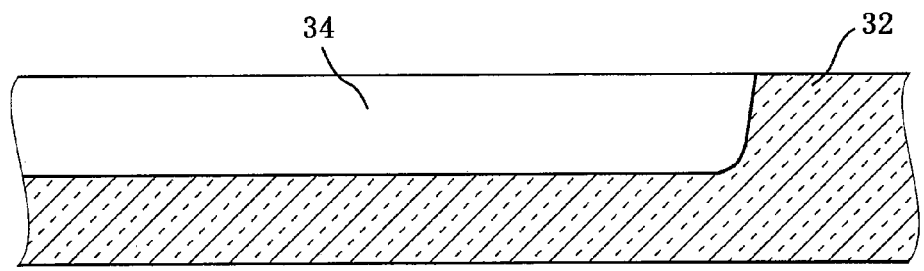
FIG. 5B is a cross-sectional view illustrating a process step for manufacturing the MEMS device according to an exemplary embodiment of the present invention.

First, cavities including cavity 34 and cavities 36h, 36j, 36k, and 36m etc. are made in the upper glass substrate 30 and the lower glass substrate 32 by a known wet etching process using a glass etching solution. In particular, patterns are formed by known photolithographic methods on the upper glass substrate 30 and the lower glass substrate 32. Then, although etching conditions depend upon the desired depth, the cavities illustrated in FIG. 5A and FIG. 5B are made by immersing the upper glass substrate 30 and the lower glass substrate 32 in a 10% hydrofluoric acid solution at 30° C. for 5 to 30 minutes. Here, the cavity 36m according to this exemplary embodiment is made in a region to subsequently communicate with one of the holes 37. This cavity is similar to the cavity 36g of FIG. 3. Etching to define the hermetic chamber is performed to the upper glass substrate 30 from one side, after which the holes 37 are made from the other side by etching or grit blasting.

Figure 5C:
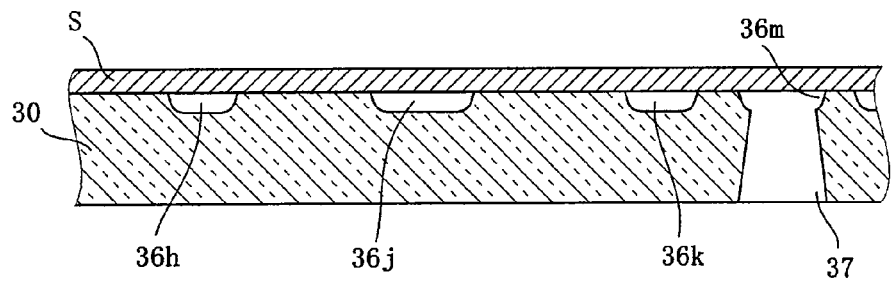
FIG. 5C is a cross-sectional view illustrating a process step for manufacturing the MEMS device according to an exemplary embodiment of the present invention.

Then, a silicon substrate S, which forms the base of the vibrator 10 performing a central role of the MEMS device according to this exemplary embodiment, is bonded to the upper glass substrate 30 by anodic bonding by known conditions such as those discussed in Japanese Published Unexamined Patent Application No. 2005-016965, as illustrated in FIG. 5C.

Figure 5D:
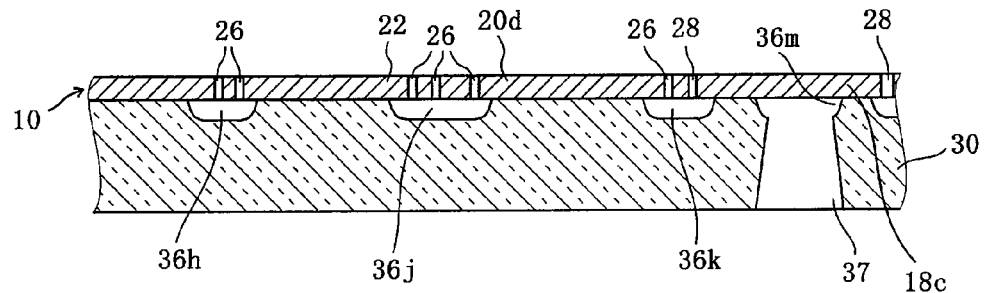
FIG. 5D is a cross-sectional view illustrating a process step for manufacturing the MEMS device according to an exemplary embodiment of the present invention.

A photoresist mask is formed on the silicon substrate S by known photolithographic methods. Known anisotropic etching technology is then used to make the trenches 26 and 28 in the silicon substrate S, thereby forming the vibrator 10 on the upper glass substrate 30, as illustrated in FIG. 5D. Examples of etching and related technology include those of other prior patent applications by the applicant of the present invention such as Japanese Published Unexamined Patent Application No. 2007-035929, Japanese Published Unexamined Patent Application No. 2002-158214, Japanese Published Unexamined Patent Application No. 2004-228556, and Japanese Published Unexamined Patent Application No. 2004-296474.

Figure 5E:
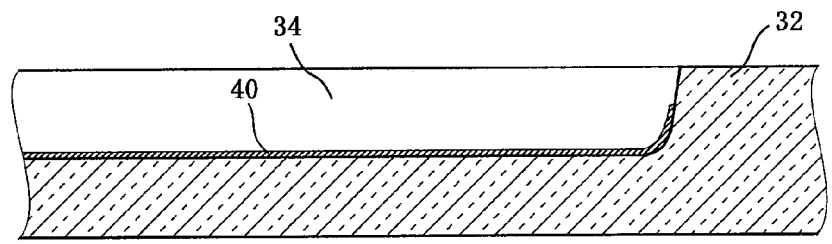
FIG. 5E is a cross-sectional view illustrating a process step for manufacturing the MEMS device according to an exemplary embodiment of the present invention.

Known sputtering or vacuum vapor deposition methods are used with a metal mask to form the titanium getter film 40 (40a, 40b, 40c) on surfaces of the lower glass substrate 32 having a cavity made therein. Here, the getter film region 40b is formed on sides of the column-shaped structure 39, and the getter film region 40c is formed on the surface of the column-shaped structure 39 having no cavity made thereupon, as illustrated in FIG. 5E and FIG. 2.

Figure 5F:
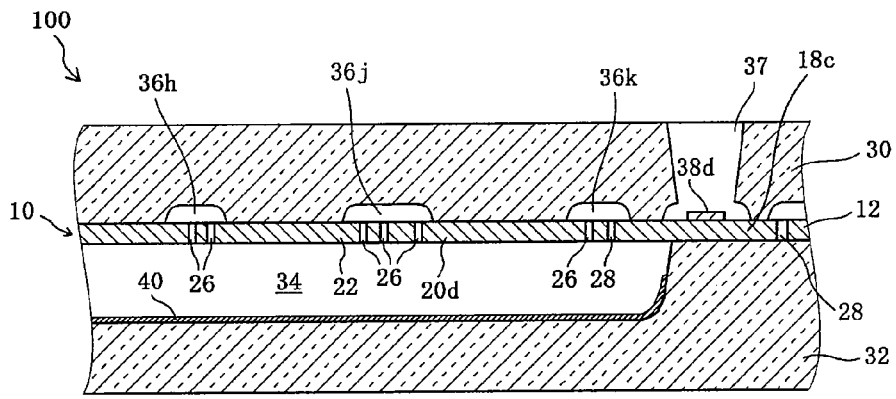
FIG. 5F is a cross-sectional view illustrating a process step for manufacturing the MEMS device according to an exemplary embodiment of the present invention.

Then, similarly to the above description, the vibrator 10 is bonded to the lower glass substrate 32 by anodic bonding using known conditions such as those discussed in Japanese Published Unexamined Patent Application No. 2005-016965. Electrode pads such as the electrode pads 38a through 38f are formed as layers of Al, Al alloy, or Au by known sputtering or vacuum vapor deposition methods, as illustrated in FIG. 5F.

After the ring or hoop-like shape resonator gyroscope 100 is manufactured as recited above, holes such as the holes 37 are made to enable wires from electric power supplies (not illustrated) to pass therethrough for connection to members such as electrode pads 38a through 38f. Finally, the ring or hoop-like shape resonator gyroscope 100 is sealed as recited above by resistance welding of the lid 42 to the resonator gyroscope platform 44 in a dry nitrogen atmosphere.

Figure 6:
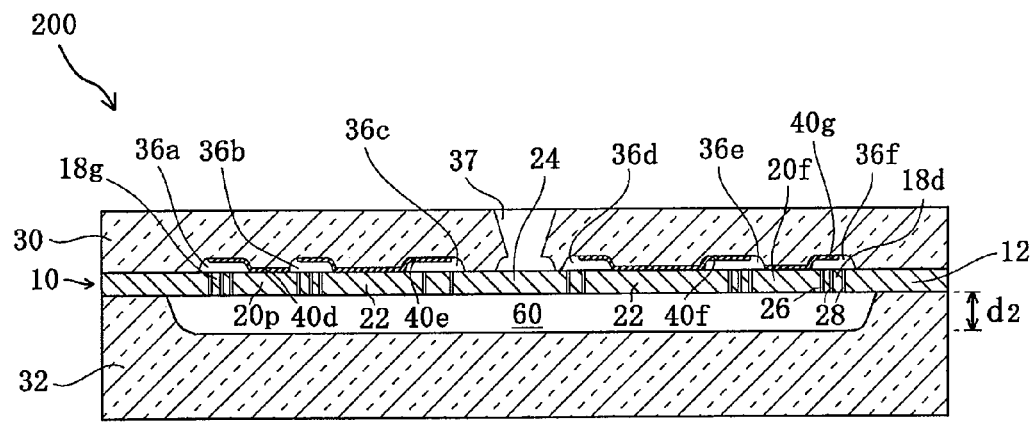
FIG. 6 is a cross-sectional view of a MEMS device according to another exemplary embodiment of the present invention.

FIG. 6 is a cross-sectional view of another ring or hoop-like shape resonator gyroscope 200 according to this exemplary embodiment of the present invention. This cross section corresponds to FIG. 3 of the first exemplary embodiment. The configuration of the ring or hoop-like shape resonator gyroscope 200 according to this exemplary embodiment is similar to that according to the first exemplary embodiment except for a cavity 60 made in the lower glass substrate 32 and the location of the getter film 40. The manufacturing methods and operational methods also are similar to those of the first exemplary embodiment. Therefore, descriptions of features and processes similar to those of the first exemplary embodiment are omitted herein for brevity.

The cavity 60 is made in the lower glass substrate 32 without leaving a column-shaped structure, as illustrated in FIG. 6. However, at least a part of each fixed portion of the vibrator 10 is bonded to the upper glass substrate 30 by anodic bonding, thereby maintaining the shape and preventing gravity from pulling the vibrator 10 down into contact with the bottom of the cavity 60. According to this exemplary embodiment, getter films 40d, 40e, 40f, and 40g are formed on the bottoms and sides of cavities 36a, 36b, 36c, 36d, 36e, and 36f made in the upper glass substrate 30, and on surfaces of glass substrates not made into cavities. Here, each of the getter films 40d, 40e, 40f, and 40g contacts any one of fixed portion of the vibrator 10 having a prescribed direct current voltage, respectively. Thus, each of the getter films 40d, 40e, 40f, and 40g substantially shares the prescribed direct current voltages of the fixed portions, respectively, and thereby are prevented from floating. Moreover, the electrical potentials are direct-current electrical potentials, and therefore each of the getter films 40d through 40g has a stable electrical potential.

According to this exemplary embodiment, and differing from those of the first exemplary embodiment, each of the getter films 40d, 40e, 40f, and 40g is formed in a distinct region of the bottom and the sides of the cavities 36a through 36f made in the upper glass substrate 30 and surfaces of glass substrates not having a cavity made thereupon. Such a division of the getter film into distinct regions relieves effects to the vibrator 10 resulting from differences in coefficients of thermal expansion between getter films and glass substrates and residual stresses, and in particular, effects to the thermal characteristics of the zero point output, etc. Moreover, similarly to that of the first exemplary embodiment, the cavity 60 is made to prevent the lower glass substrate 32 from bonding to the entire region in which each fixed portion of the vibrator 10 contacts each of the getter films 40d through 40g.

According to this exemplary embodiment, even in the case where the depth d2 of the cavity 60 illustrated in FIG. 6 is 20 µm, the getter films do not facilitate capacitive coupling transmitting electric noise among electrodes. In the case of a MEMS device, such as that according to this exemplary embodiment, in which the movable portion moves substantially in the same plane as the fixed portion, the depth d2 can be not less than 5 µm. In the case of a MEMS device in which the movable portion moves substantially perpendicular to the plane of the fixed portion, it is favorable for the depth d2 to be not less than 10 µm. There is no particular maximum limit to the depth of the cavity 60, but considerations such as minimizing the time to form the cavity 60 and the amount of gases released, considered to be a function of the surface areas of the inner walls of the hermetic chamber, dictate that it is favorable to use a depth d2 of 60 µm or less. According to this exemplary embodiment as well, the cavities in the upper glass substrate 30 may have similar depths as those of the lower glass substrate 32. The depths of the cavities in the upper glass substrate 30 can be reduced further providing that the movement of the vibrator 10 is not impaired.

The ability to absorb gases is different for each getter material and formation conditions thereof. Moreover, the amount of gases released varies with factors such as the conditions of the anodic bonding. In some cases therefore, one or more of the getter films 40d, 40e, 40f, and 40g may be eliminated while achieving the objects recited above.

Figure 7:
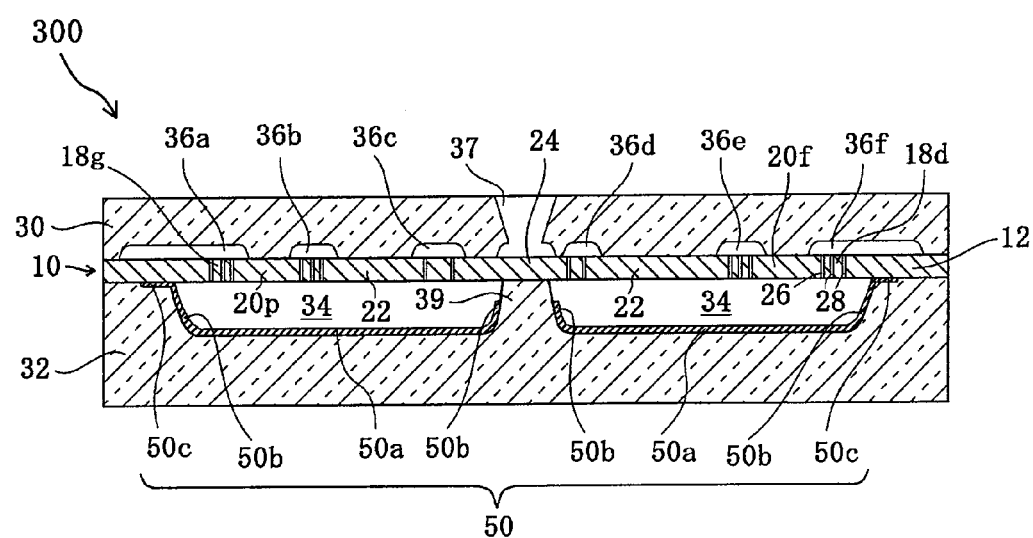
FIG. 7 is a cross-sectional view of a MEMS device according to another exemplary embodiment of the present invention.

FIG. 7 is a cross-sectional view illustrating another ring or hoop-like shape resonator gyroscope 300 according to this exemplary embodiment. This cross-section corresponds to FIG. 3 of the first exemplary embodiment. The configuration of the ring or hoop-like shape resonator gyroscope 300 of this exemplary embodiment is similar to that of the first exemplary embodiment except for some of the cavities made in the upper glass substrate 30 and the location of a getter film 50. The manufacturing methods and operational methods are similar to those of the first exemplary embodiment. Therefore, descriptions of features and processes similar to those of the first exemplary embodiment are omitted herein for brevity.

The getter film 50 is formed on the bottom and the sides of a cavity made in the lower glass substrate 32, and on a surface of a periphery of the lower glass substrate 32 not having a cavity made thereupon, thereby surrounding the column-shaped structure 39, as illustrated in FIG. 7. In particular, the getter film 50 includes: a getter film region 50a formed on the bottom of the cavity; getter film region 50b formed on the sides of the cavity; and a getter film region 50c formed on a surface of a periphery of the lower glass substrate 32 not having a cavity made thereupon. The getter film regions 50a, 50b, and 50c are interconnected and continuous. The getter film region 50b according to this exemplary embodiment is formed on the side of the column-shaped structure 39, and therefore does not contact the central portion 24. However, the getter film region 50b formed on the side of the periphery is continuous with the getter film region 50c on the surface of the lower glass substrate not having a cavity made thereupon, and the getter film region 50c contacts a periphery 12 of the vibrator 10.

Here, the periphery 12 of the vibrator 10 is connected to a ground potential as recited above. Therefore, the getter film 50 in its entirety shares the ground potential and thus is prevented from having a floating electrical potential. Thus, similar to those according to the first exemplary embodiment, the depths of the cavities may be in the range from 5 μm to 30 μm inclusive without facilitating a transmission of electric noise to the sensors or the driver. The getter film region 50c according to this exemplary embodiment is not formed on all regions of the periphery 12. This configuration thereby increases the anodic bonding regions of the silicon vibrator 10 and the glass substrate. The cavity 36a and the cavity 36f made in the upper glass substrate 30 are enlarged to to relieve the effects of compressive stress resulting from the presence of the getter film region 50c. For example, even in the case where a thickness of the getter film 50 is 2 μm or less, such a configuration for relieving shear forces in this fashion improves the reliability of the MEMS device.

Although according to the first exemplary embodiment recited above, the electrical potential of the getter film 40 is stabilized by utilizing the column-shaped structure 39 and the central portion 24 of the vibrator 10 supported thereby, the present invention is not limited to such a configuration. For example, regarding the configuration of cavity in the lower glass substrate 32, a column-shaped structure having getter film regions 40b and 40c formed thereupon may support a tab remaining from etching 22, such as that of a ring or hoop-like shape resonator gyroscope 400 illustrated in the cross-sectional view of FIG. 8. The tabs remaining from etching 22 receive substantially the same predetermined electrical potential as the central portion 24 during operation of the vibrator 10, and therefore similar effects are achieved as those of the first exemplary embodiment. Likewise, similarly to the basis recited above, the effects of the present invention may be achieved in the case where the region of the vibrator 10 supported by the column-shaped structure is, for example, one of the electrodes for trimming the natural frequency 20a through 20s and has a predetermined electrical potential.

Figure 8:
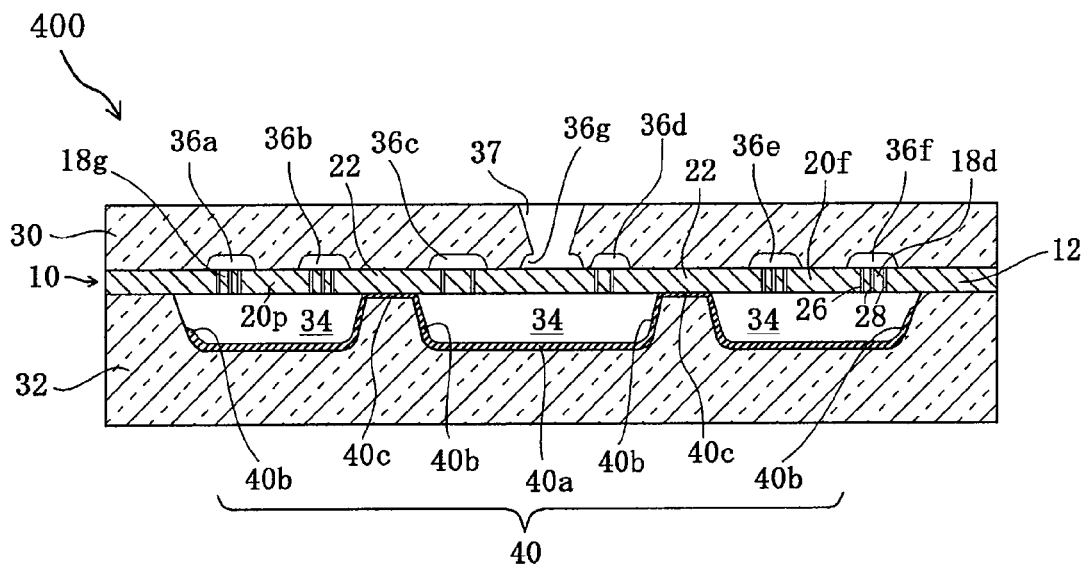
FIG. 8 is a cross-sectional view of a MEMS device according to another exemplary embodiment of the present invention.
Figure 9:
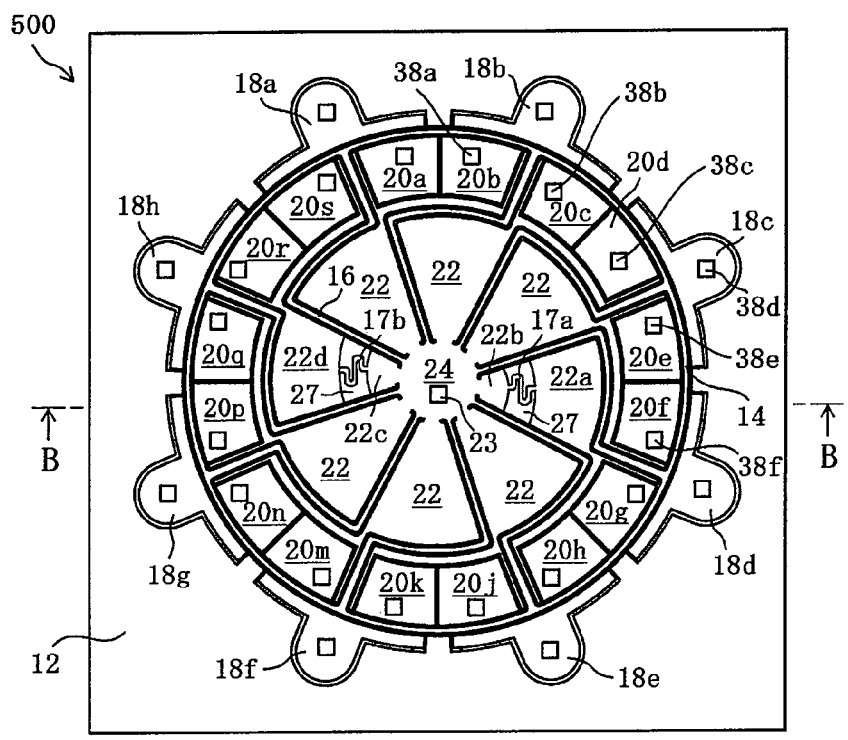
FIG. 9 is a front view of a MEMS device according to another exemplary embodiment of the present invention.
Figure 10:
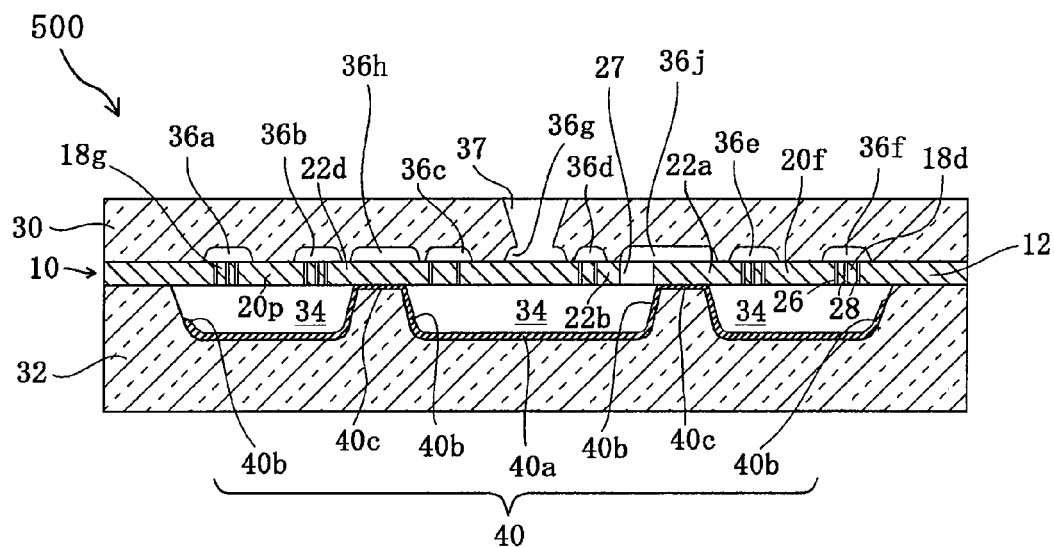
FIG. 10 is a cross-sectional view of the MEMS device according to another exemplary modification of the present invention.

Furthermore, another exemplary embodiment including a partial modification to the configuration of the ring or hoop-shape resonator gyroscope illustrated in FIG. 8 is described. FIG. 9 is a front view illustrating a MEMS device, i.e., a ring or hoop-like shape resonator gyroscope 500. FIG. 10 is a partial cross-sectional view of the ring or hoop-like shape resonator gyroscope 500 along the line B-B of FIG. 9. According to this exemplary embodiment, a tab remaining from etching supported by a column-shaped structure having the getter film region 40c formed thereupon is divided by a trench 27 into two tabs remaining from etching 22a and 22b. The regions 22a and 22b are connected by a suspension 17a. Also, another tab remaining from etching is divided by a trench 27 into two tabs remaining from etching 22c and 22d. The regions 22c and 22d are connected by a suspension 17b. The cavities 36h and 36j provide recesses, and therefore a region from the suspension 17a through the tab remaining from etching 22a and a region from the suspension 17b through the tab remaining from etching 22d, excluding portions sufficiently distal from the suspensions 17a and 17b, are not bonded continuously to the upper glass substrate 30. The formation of the cavities 36h and 36j and the suspensions 17a and 17b allows greater flexure by the tabs remaining from etching 22a and 22d, respectively, thereby further reducing the effects of compressive stresses in the tabs remaining from etching 22 induced by the presence of the getter film region 40c. As a result, the operation of the vibrator 10 is made more stable. More flexure is possible in the case where the entire regions of the tabs remaining from etching 22a and 22d are not bonded to the upper glass substrate 30. However, providing that the flexures of the tabs remaining from etching 22a and 22d for relieving compressive stresses are not substantially impaired, portions of the tabs remaining from etching 22a and 22d may be bonded to a glass substrate as illustrated in FIG. 10. Moreover, the suspensions 17a and 17b can be defined by modifying the mask used for trench etching in the silicon substrate according to the exemplary embodiments recited above, and therefore do not require additional process steps.

Furthermore, in each of the exemplary embodiments recited above, a ring or hoop-like shape resonator gyroscope is discussed as one examples of a MEMS device, but implementation of the present invention to MEMS devices is not limited to these applications. The present invention may be implemented for other MEMS devices that also can be favorably formed inside a hermetic chamber. In particular, micro mirrors and radio frequency (RF) switches are typical examples of MEMS devices to which the present invention may be implemented.

Still Furthermore, in each of the exemplary embodiments recited above, getter films are formed on sides as well as bottoms of the cavities, but the present invention is not limited to such configurations. For example, regarding an inward of a cavity, the cavities according to this exemplary embodiment have sides extending upwardly, and tapering outwardly, from the bottom surface, and therefore a getter film may be formed only on the sides thereon by changing the mask pattern. Accordingly, the getter film connects via a base material of the MEMS device from the sides of the cavity to only one of any one of predetermined electrical potentials of the fixed portion and a ground potential of the fixed portion of the MEMS device.

Figure 11A:
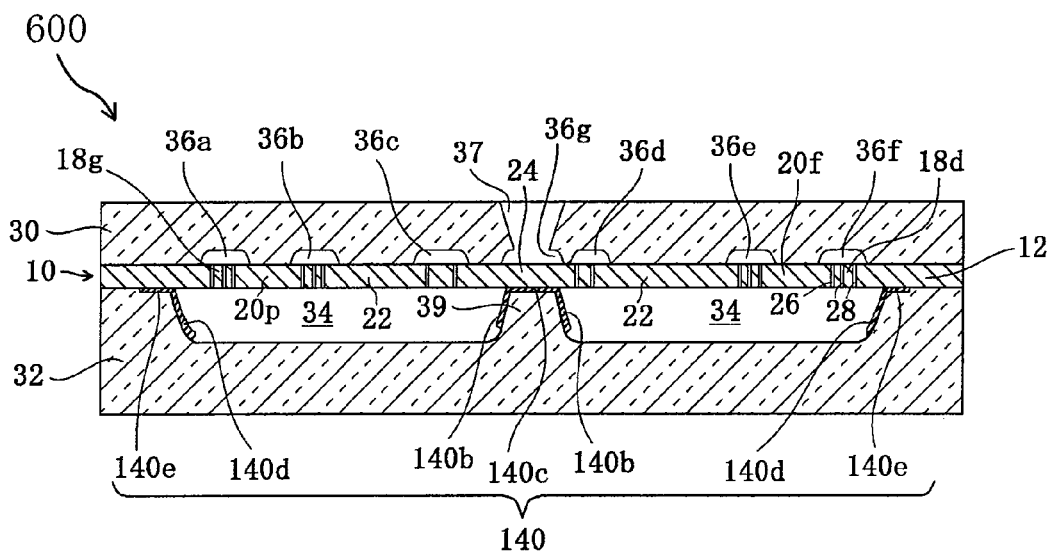
FIG. 11A is a cross-sectional view corresponding to FIG. 3 of the MEMS device according to another exemplary embodiment of the present invention.
Figure 11B:
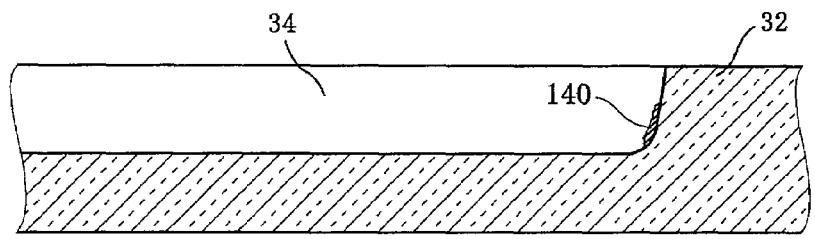
FIG. 11B is a cross-sectional view illustrating a process step for manufacturing the MEMS device according to another exemplary embodiment of the present invention.
Figure 11C:
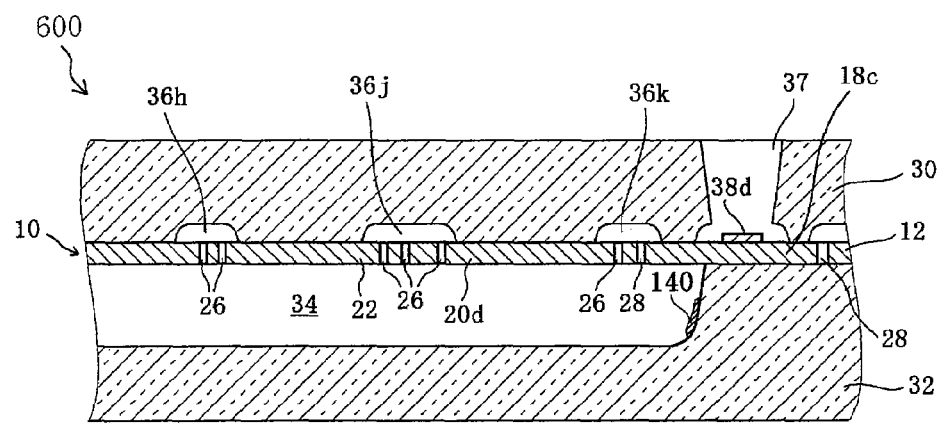
FIG. 11C is a cross-sectional view illustrating a process step for manufacturing the MEMS device according to another exemplary embodiment of the present invention.
Figure 12:
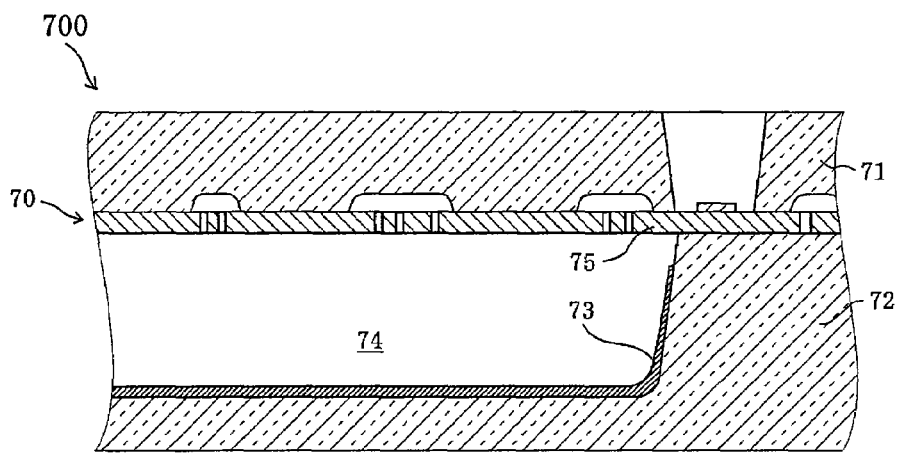
FIG. 12 is a partial cross-sectional view of a conventional MEMS device.

For example, FIG. 11A is a cross-sectional view of a ring or hoop-like shape resonator gyroscope 600 that is MEMS device, an example of another exemplary embodiment. Furthermore, FIG. 11A is a figure corresponding to FIG. 3 of the first exemplary embodiment. Yet furthermore, FIG. 11B is a partial cross-sectional view corresponding to FIG. 5E. Still furthermore, FIG. 11C is a partial cross-sectional view corresponding to FIG. 5F. The configuration of the ring or hoop-like shape resonator gyroscope 600 of the exemplary embodiment is similar to that of the first exemplary embodiment except for the getter film 140. Furthermore, the manufacturing methods are similar to those of the first exemplary embodiment except for process steps illustrated in FIG. 1B and FIG. 11C. Yet furthermore, the operational methods are also similar to those of the first exemplary embodiment. Therefore, descriptions of features and processes similar to those of the first exemplary embodiment are omitted herein for brevity.

The cavities according to this exemplary embodiment have sides extending upwardly, and tapering outwardly, from the bottom surface, and therefore a getter film 140 is formed only on the sides of the cavity and the column-shaped structure 39, and only on a region formed on a surface of a periphery of the lower glass substrate 32 not having a cavity made thereupon, by changing the mask pattern, as illustrated in FIG. 11A. In FIG. 11A, a getter film region formed on the bottom of the cavity is not formed. However, a getter film region 140b on the sides is continuous with a getter film 140c on a column-shaped structure 39. Furthermore, another getter film region 140d on the sides is continuous with the getter film region 140e on a surface of a periphery of the lower glass substrate 32 not having a cavity made thereupon.

The periphery 12 of the vibrator 10 is connected to a ground potential. Accordingly, the getter film region 140d and getter film region 140e share the ground potential, thereby preventing a floating condition. On the other hand, similarly to that of the first exemplary embodiment, the getter film region 140b and the getter film 140c substantially share the electrical potential applied to the central portion 24, thereby preventing a floating condition. The electrical potential is a direct-current electrical potential and therefore stabilizes the electrical potential of the getter film 140 as well. In FIG. 11B and FIG. 11C, the getter film 40 fails to be continuous to the surface of the periphery of the lower glass substrate 32 not having a cavity made thereupon due to a presence of the primary mode sensing electrode 18c. Accordingly, the getter film 140 illustrated in FIG. 11B and FIG. 11C is formed, by utilizing a continuous getter film on the sides of the cavity that is not illustrated, to be continuous with the getter film region 140d illustrated in FIG. 11A.

As described above, regarding an inward of a cavity, even when the getter film 140 (140b, 140d) is formed only on the sides thereon, an effect of the same quality as that of the present invention is obtained by getting a stability of the electrical potential of the getter film 140. In addition, the configuration that does not form a getter film region on a bottom of the cavity 60 may be also applied to other exemplary embodiments except for the first exemplary embodiment. Moreover, in the exemplary embodiments, absorption of residual gases after the anodic bonding by the getter film 140 is decreased as compared with that of the first exemplary embodiment, because the getter film region on a bottom of the cavity 60 is not formed. Accordingly, from the viewpoint of absorption of residual gases, the first exemplary embodiment is preferable to the exemplary embodiment. Concretely, as illustrated in the first exemplary embodiment, the getter film formed on not less than 50% of a total surface area of the cavity is one preferable exemplary embodiment from the viewpoint of absorption of residual gases.

Still furthermore, in each of the exemplary embodiments recited above, the getter according to this exemplary embodiment is made of titanium, but the present invention is not limited to this material. The getter may include, for example, one or more metals selected from the group consisting of zirconium, vanadium, aluminum, tantalum, tungsten, and molybdenum. This exemplary embodiment utilizes a ring or hoop-like shape resonator gyroscope having silicon base material, but the present invention is not limited to this material. For example, the base material of the MEMS device can be made of germanium or silicon-germanium. As recited above, modifications within the scope of the present invention are included also in the scope of the patent claims.

The present invention may be implemented for MEMS devices including acceleration sensors, angular velocity sensors, micro mirrors, and RF switches formed inside hermetic chambers.

What is claimed is:

1. A MEMS device comprising a movable portion and a fixed portion formed inside a hermetic chamber, wherein:
   the hermetic chamber is formed by a glass substrate having a cavity made therein and a base material of the MEMS device; and
   a portion of one or a plurality of continuous getter films formed inside the hermetic chamber connects via the base material of the MEMS device to only one of any one or a plurality of predetermined electrical potentials of the fixed portion and a ground potential of the fixed portion.

2. The MEMS device according to claim 1, wherein the getter film is formed on not less than 50% of a total surface area of the cavity.

3. The MEMS device according to claim 1, wherein a distance from a surface of the MEMS device to a bottom of the cavity is not less than 5 μm and not more than 60 μm.

4. The MEMS device according to claim 1, wherein the getter film comprises at least one type of metal selected from the group consisting of titanium, zirconium, vanadium, aluminum, tantalum, tungsten, and molybdenum.

5. A MEMS device comprising a movable portion and a fixed portion formed inside a hermetic chamber, wherein:
   the hermetic chamber is formed by a glass substrate having a cavity made therein and a base material of the MEMS device;
   a getter film is formed on a bottom surface and a side surface, or a side surface of the cavity, the getter film extending from at least one of a bottom surface and a side surface via a surface of a support of the glass substrate supporting the MEMS device, contacting to a surface of at least a portion of the fixed portion connecting to only any one or a plurality of predetermined electrical potentials; and
   at least the fixed portion contacting the getter film are not bonded to the glass substrate.

6. A MEMS device comprising a movable portion and a fixed portion formed inside a hermetic chamber, wherein:
   the hermetic chamber is formed by a glass substrate having a cavity made therein and a base material of the MEMS device;
   a getter film is formed on a bottom surface and a side surface, or a side surface of the cavity, the getter film extending from at least one of a bottom surface and a side surface via a surface of a support of the glass substrate supporting the MEMS device, contacting to a surface of at least a portion of the fixed portion connecting to only any one or a plurality of predetermined electrical potentials; and
   the fixed portion contacting the getter film connects via an elastic structure to the fixed portion having no contact with the getter film, and is not bonded to the glass substrate continuously from the elastic structure through the fixed portion contacting the getter film.

7. A MEMS device comprising a movable portion and a fixed portion formed inside a hermetic chamber, wherein:
   the hermetic chamber is formed by a glass substrate having a cavity made therein and a base material of the MEMS device;
   a getter film is formed on a bottom surface and a side surface, or a side surface of the cavity, the getter film extending from at least one of a bottom surface and a side surface, contacting to a surface of at least a portion of the fixed portion connecting to only a ground potential; and
   at least the fixed portion contacting the getter film are not bonded to the glass substrate.

8. A MEMS device comprising a movable portion and a fixed portion formed inside a hermetic chamber, wherein:
   the hermetic chamber is formed by a glass substrate having a cavity made therein and a base material of the MEMS device;
   a getter film is formed on a bottom surface and a side surface, or a side surface of the cavity, the getter film extending from at least one of a bottom surface and a side surface, contacting to a surface of at least a portion of the fixed portion connecting to only a ground potential;

at least the fixed portion contacting the getter film are not bonded to the glass substrate; and the fixed portion contacting the getter film connects via an elastic structure to the fixed portion having no contact with the getter film, and is not bonded to the glass substrate continuously from the elastic structure through the fixed portion contacting the getter film.

9. The MEMS device according to any one of claims 5 through 8, wherein the getter film is formed on not less than 50% of a total surface area of the cavity.

10. The MEMS device according to any one of claims 5 through 8, wherein a distance from a surface of the MEMS device to a bottom of the cavity is not less than 5 μm and not more than 60 μm.

11. The MEMS device according to any one of claims 5 through 8, wherein the getter film comprises at least one type of metal selected from the group consisting of titanium, zirconium, vanadium, aluminum, tantalum, tungsten, and molybdenum.

* * * * *